US010411665B2

(12) United States Patent
Johnson et al.

(10) Patent No.: US 10,411,665 B2
(45) Date of Patent: Sep. 10, 2019

(54) RESONANT CAVITY COMBINED SOLID STATE AMPLIFIER SYSTEM

(71) Applicant: Diversified Technologies, Inc., Bedford, MA (US)

(72) Inventors: Erik G. Johnson, Cambridge, MA (US); Marcel P. J. Gaudreau, Lexington, MA (US); John Kinross-Wright, Bedford, MA (US); Frederick Marvin Niell, III, Tampa, FL (US); David B. Cope, Medfield, MA (US)

(73) Assignee: Diversified Technologies, Inc., Bedford, MA (US)

( * ) Notice: Subject to any disclaimer, the term of this patent is extended or adjusted under 35 U.S.C. 154(b) by 0 days.

(21) Appl. No.: 15/593,813

(22) Filed: May 12, 2017

(65) Prior Publication Data

US 2018/0331666 A1 Nov. 15, 2018

(51) Int. Cl.
*H03F 3/60* (2006.01)
*H03F 1/56* (2006.01)

(52) U.S. Cl.
CPC .............. *H03F 3/602* (2013.01); *H03F 1/56* (2013.01); *H03F 2200/222* (2013.01); *H03F 2200/423* (2013.01); *H03F 2200/451* (2013.01)

(58) Field of Classification Search
CPC ............. H03F 3/602; H03F 200/222; H03F 2200/423; H03F 2200/451

(Continued)

(56) References Cited

U.S. PATENT DOCUMENTS 3,628,171 A 12/1971 Kurokawa et al.
6,724,261 B2 * 4/2004 Cheo ............... H03F 3/602
330/295

(Continued)

OTHER PUBLICATIONS

Gaudreau et al., "High Efficiency High Power Resonant Cavity Amplifier for Accelerator Applications", Proceedings of IPAC2017, 2017, http://accelconf.web.cern.ch/AccelConf/pac2017/papers/thplik17.pdf, 3 pages.

(Continued)

*Primary Examiner* — Robert J Pascal
*Assistant Examiner* — Kimberly E Glenn
(74) *Attorney, Agent, or Firm* — Iandiorio Teska & Coleman, LLP

(57) ABSTRACT

A resonant cavity combined solid-state amplifier system including a resonant cavity having at least one output port coupled to a high-power transmission line. A plurality of high-power transistors are each configured to generate a variable amount of power input directly into the resonant cavity. The plurality of high-power transistors may be configured such that a failure of one or more of the plurality of high-power transistors does not substantially impede operation of the resonant cavity. A plurality of output impedance matching networks each coupled to one of the plurality of high-power transistors and extending into the resonant cavity are configured to match an impedance of each transistor to an impedance of the resonant cavity and configured to electromagnetically couple power from each of the plurality of high-power transistors into the resonant cavity to provide a combined high-power output to the high-power transmission line.

23 Claims, 14 Drawing Sheets

(58) Field of Classification Search
USPC .................................................. 333/124–129
See application file for complete search history.

(56) References Cited

U.S. PATENT DOCUMENTS

2002/0105383 A1    8/2002   Cheo
2015/0303560 A1   10/2015   Ahn

OTHER PUBLICATIONS

Written Opinion of the International Searching Authority, dated Aug. 3, 2018 in International Application No. PCT/US2018/031752, four (4) pages.

* cited by examiner

RESONANT CAVITY COMBINED SOLID STATE AMPLIFIER SYSTEM

FIELD OF THE INVENTION

This invention relates to a resonant cavity combined solid state amplifier system.

BACKGROUND OF THE INVENTION

High-power transistor, such as microwave transistors, are available with power levels up to about 1000 watts at radio frequencies, decreasing to less than about 100 watts at higher microwave frequencies. For applications requiring a much greater power level than the power level of a single high-power transistor, the outputs of a number of high-power transistors needs to be coherently combined.

One conventional system to combine the outputs of a number of high-power transistors relies on building many individual amplifier modules, each with a single transistor, and then combining the outputs of the amplifier modules using a microwave power combiner. Such a conventional system typically requires a set of microwave cables, electrical power cables and cooling lines for each module. For a high-power solid-state amplifier with many modules this may represent a significant complexity which may increase costs and potentially decreases reliability. Moreover, in the event of a failure of one or more of the modules or transistors, the conventional system is typically turned off and the defective high-power transistor or amplifier module must be replaced.

BRIEF SUMMARY OF THE INVENTION

In one aspect, a resonant cavity combined solid-state amplifier system is featured. The system includes a resonant cavity including at least one output port coupled to a high-power transmission line. A plurality of high-power transistors are each configured to generate a variable amount of power input directly into the resonant cavity. A plurality of output impedance matching networks are each coupled to one of the plurality of high-power transistors and extend into the resonant cavity and configured to match an impedance of each transistor to an impedance of the resonant cavity and configured to electromagnetically couple power from each of the plurality of high-power transistors into the resonant cavity to provide a combined high-power output to the high-power transmission line.

In one embodiment, each output impedance matching network may include at least one transmission line. The output impedance matching network may include a coupling loop coupled to the transmission line to electromagnetically couple power. The output impedance matching network may include an electric element coupled to the transmission line to electromagnetically couple power. The plurality of transistors may include a predetermined number N of high-power transistors. A combined power of the N high-power transistors may be combined in the resonant cavity to provide single combined high-power output. The system may include a plurality of input matching impedance networks each coupled to one of the high-power transistors configured to match an impedance of RF signals to an input impedance of one of the high-power transistors. The system may include an RF cavity splitter coupled to each of the plurality of input impedance matching networks configured to simultaneously divide an RF signal from an RF signal source into identical separate RF drive signals for each of the plurality of input impedance matching networks each coupled to one of the plurality of high-power transistors. The transmission line may include one or more stubs configured to resonate power from each of the plurality of transistors into the cavity. The one or more stubs may be located proximate an end of the transmission line. Each output impedance matching network may be configured to operate the plurality of transistors in one or more amplification classes. The amplification classes may include one or more of amplification classes: A, B, AB, C, D, E, and F. The plurality of high-power transistors may be configured such that a failure of one or more of the plurality of high-power transistors does not substantially impede operation of the resonant cavity. Each output impedance matching network may include at least one transmission line having a length configured such that a failure of one or more of the plurality of transistors does not substantially impede operation of the resonant cavity. Each output impedance matching network may include at least one transmission line having a length configured to provide approximately a ¼ wavelength transmission line impedance transformation at the fundamental frequency of the resonant cavity. A failure of one or more of the high-power transistors may include a soft failure. The soft failure may include at least one shorted high-power transistor or a fused DC choke. The system may include a DC power choke coupled between a DC bus and each of the plurality of output impedance networks configured to isolate a failed transistor from the DC bus. The system may include a frequency tuning device coupled to the resonant cavity configured to adjust a resonant frequency of the resonant cavity to adjust and/or improve operation of a resonant cavity. The system may include a variable output power coupling device coupled to the resonant cavity configured to extract a desired power to the combined high-power output or compensate for a failure of one or more of the plurality of high-power transistors. The system may include a variable output power coupling device configured to extract a desired power. A cooling line embedded in one or more plates of the resonant cavity may be configured to cool one or more plates of the resonant cavity and each of the plurality of high-power transistors directly thermally coupled to one or more plates. The transmission line includes a plurality of asymmetrically trimmed connection points between one of the high-power transistors and the transmission line.

In another aspect, a modular resonant cavity system is featured. The system includes a plurality of resonant cavities in which each includes at least one output port coupled to a resonant cavity high-power transmission line. A plurality of high-power transistors is coupled to each of the resonant cavities each configured to generate a variable amount of power input directly to each cavity. A plurality of output impedance matching networks each coupled to one of the plurality of high-power transistors of each of the plurality of resonant cavities and extending into each resonant cavity is configured to match an impedance of each the transistor to an impedance of each resonant cavity and configured to electromagnetically couple power from each of the plurality of high-power transistors into each resonant cavity to provide a combined high-power output coupled to each resonant cavity high-power transmission line. A combiner-resonant cavity is coupled to each of the resonant cavity high-power transmission lines and is configured to combine the combined high-power of each resonant cavity high-power transmission line to a higher power transmission line.

The subject invention, however, in other embodiments, need not achieve all these objectives and the claims hereof should not be limited to structures or methods capable of achieving these objectives.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Figure 1:
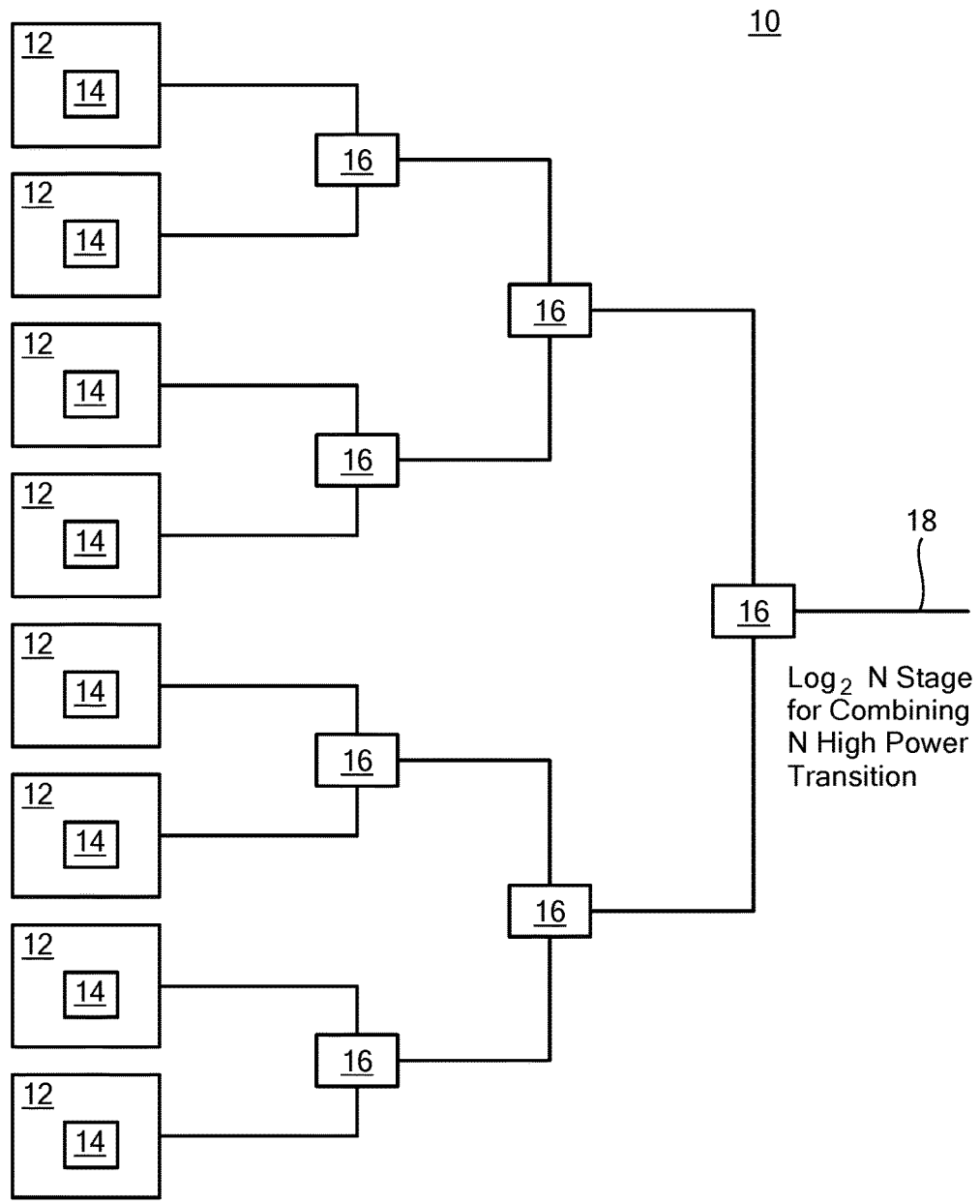
FIG. 1 is a schematic block diagram showing one example of a conventional system used to combine a plurality of high-power transistors to a single combined high-power output.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

As discussed in the Background section above, one conventional system to combine the outputs of a number of high-power transistors relies on building many individual amplifier modules, each with a single transistor, and then combining the outputs of the amplifier modules using a conventional microwave power combiner. FIG. 1 shows an example of conventional system 10 used to combine the outputs of N high-power inputs, e.g., plurality amplifier modules each having a transistor, in this example eight amplifier modules, exemplarily indicated at 12, each having high-power transistor 14. Conventional system 10 then combines the output power of each transistors 14 of each amplifier module 12 using microwave binary combiners 16 as shown to provide a combined high-power output 18. Typically, there is $\log_2 N$ stages and $2N-1$ total connections for combing N transistors 14. Each amplifier module 12 typically requires a set of microwave cables, electrical power cables, cooling lines, and the like. The complex design of conventional system 10 may increase costs and decrease reliability. Moreover, in the event of a failure of one or more of amplifier modules 12 or high-power transistors 14, conventional system 10 is typically turned off and the module must be replaced.

Figure 2:
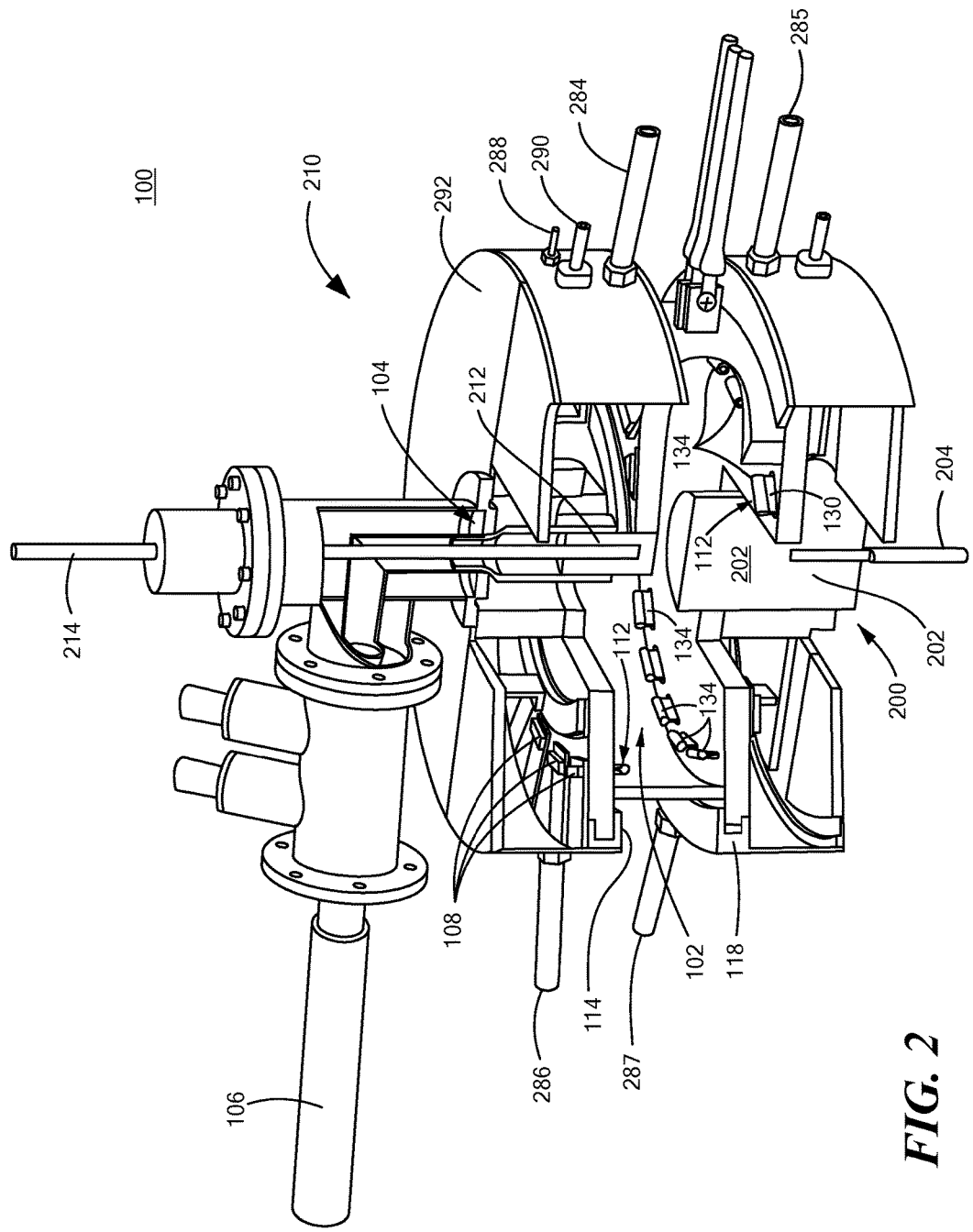
FIG. 2 is a three-dimensional isometric-view showing the primary components of one embodiment of the resonant cavity combined solid-state amplifier system of this invention.

There is shown in FIG. 2 one embodiment of resonant cavity combined solid-state amplifier system 100 of this invention. System 100 includes resonant cavity 102 including at least one output port 104 coupled to high-power transmission line 106. System 100 also includes a plurality of high-power transistors, exemplarily indicated at 108, shown in greater detail in FIGS. 3 and 4, each configured to generate a variable amount of power directly into resonant cavity 102. In one example, each of high-power transistors 108 may be configured to provide up to about 1000 watts at radio frequencies or up to about 100 watts at higher frequencies, e.g., frequencies in the range of about 100 MHz to about 10 GHz. In one example, system 100 may include eight high-power transistors 108, e.g., as shown in FIG. 4. In other examples, system 100 may include any number of high-power transistors 108 needed for a combined high-power output which is output to at least one output port 104 coupled to high-power transmission line 106.

Figure 3:
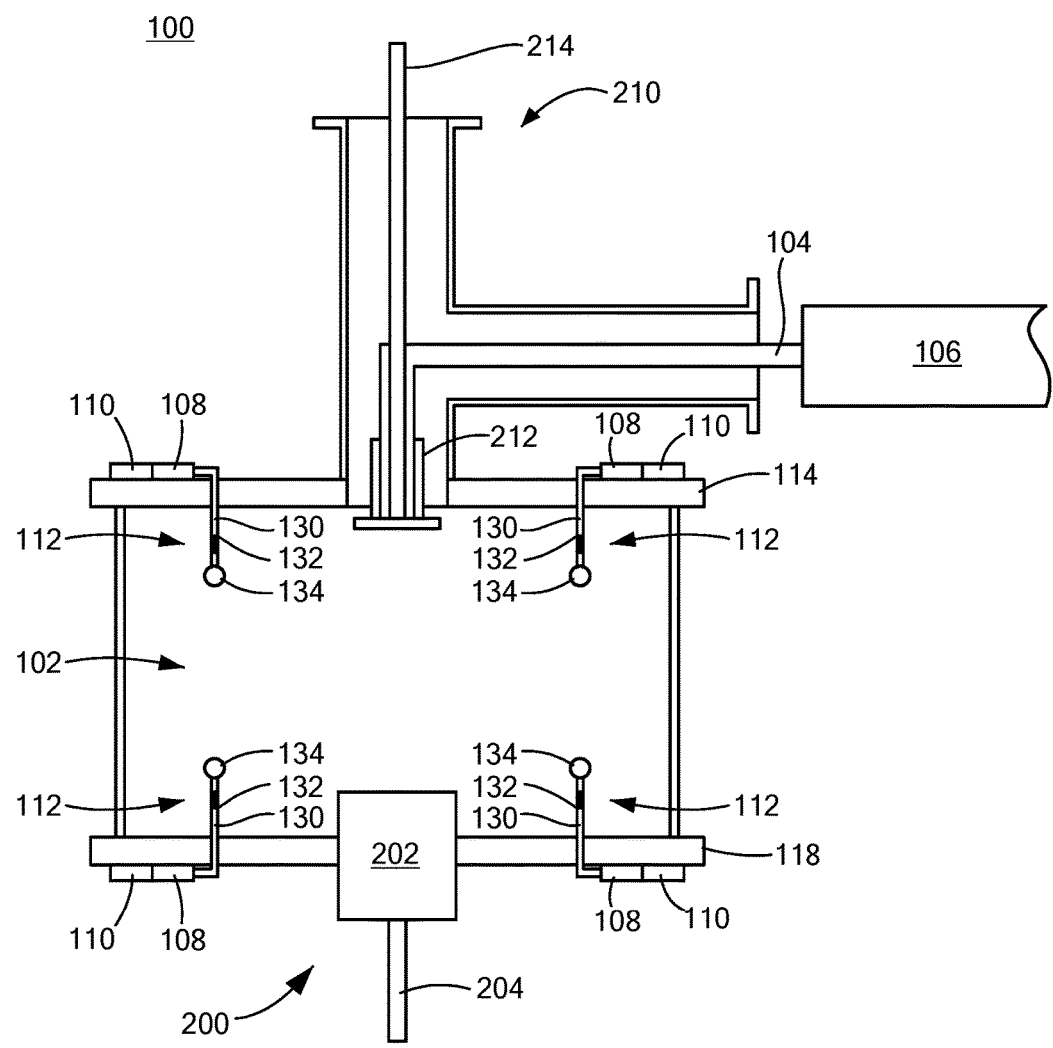
FIG. 3 is a front cross-sectional view showing the primary components of one embodiment of the resonant cavity combined solid-state amplifier system of this invention.
Figure 4:
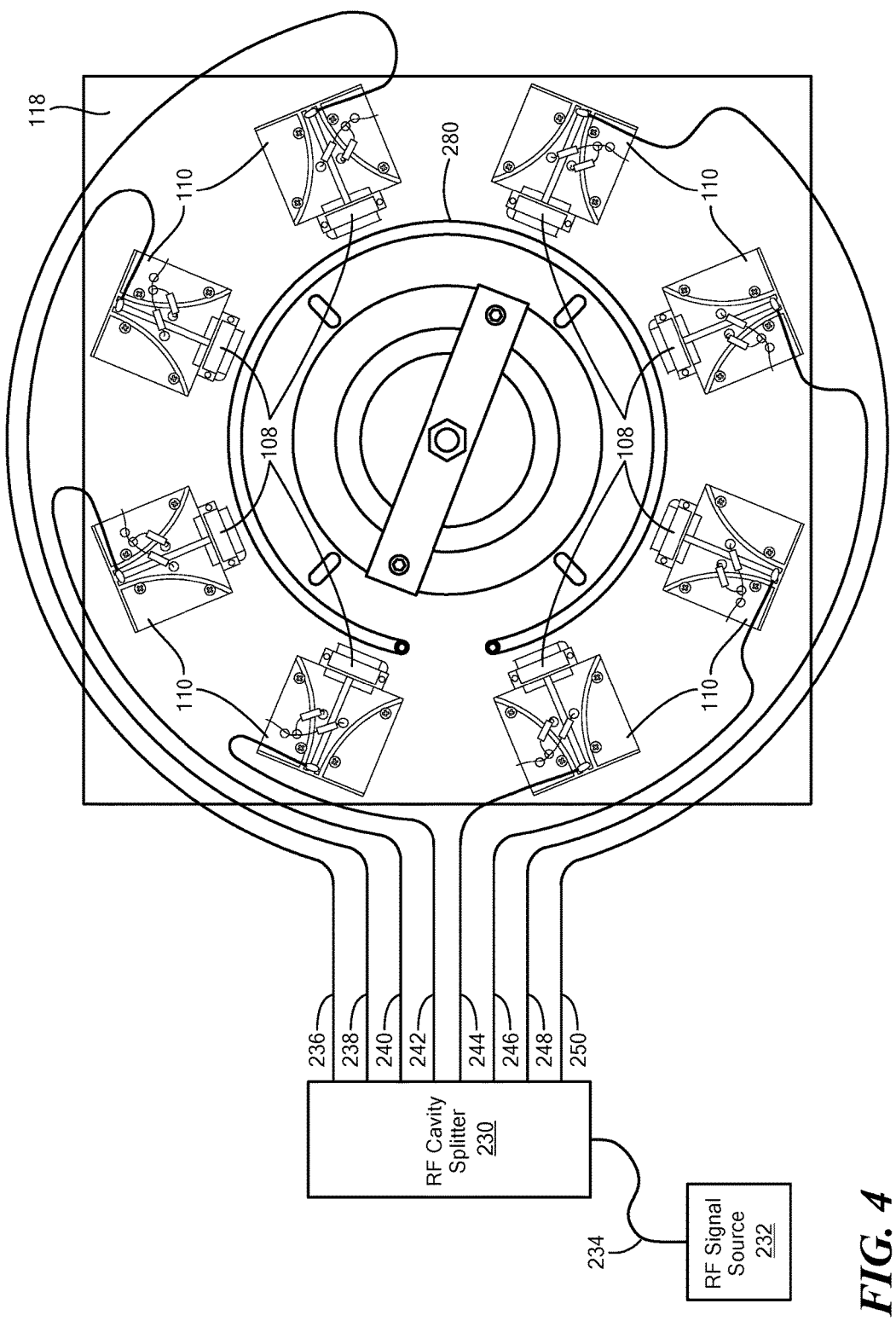
FIG. 4 is a three-dimensional front-view of the system shown in FIGS. 2 and 3 showing in further detail one example of the plurality of input impedance matching networks.
Figure 5A:
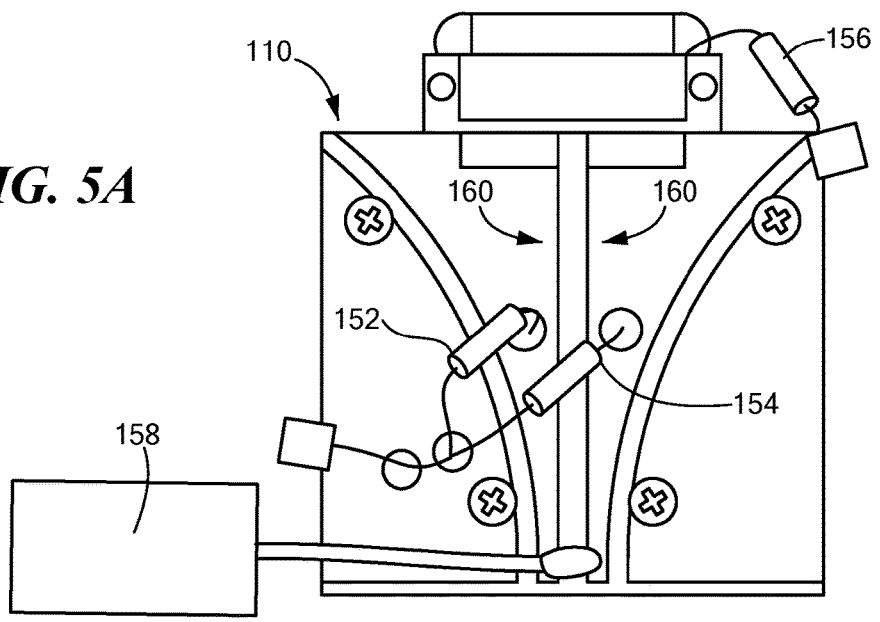
FIG. 5A is a three-dimensional front-view showing in further detail one of the plurality of input impedance matching networks shown in FIGS. 2-4.
Figure 5B:
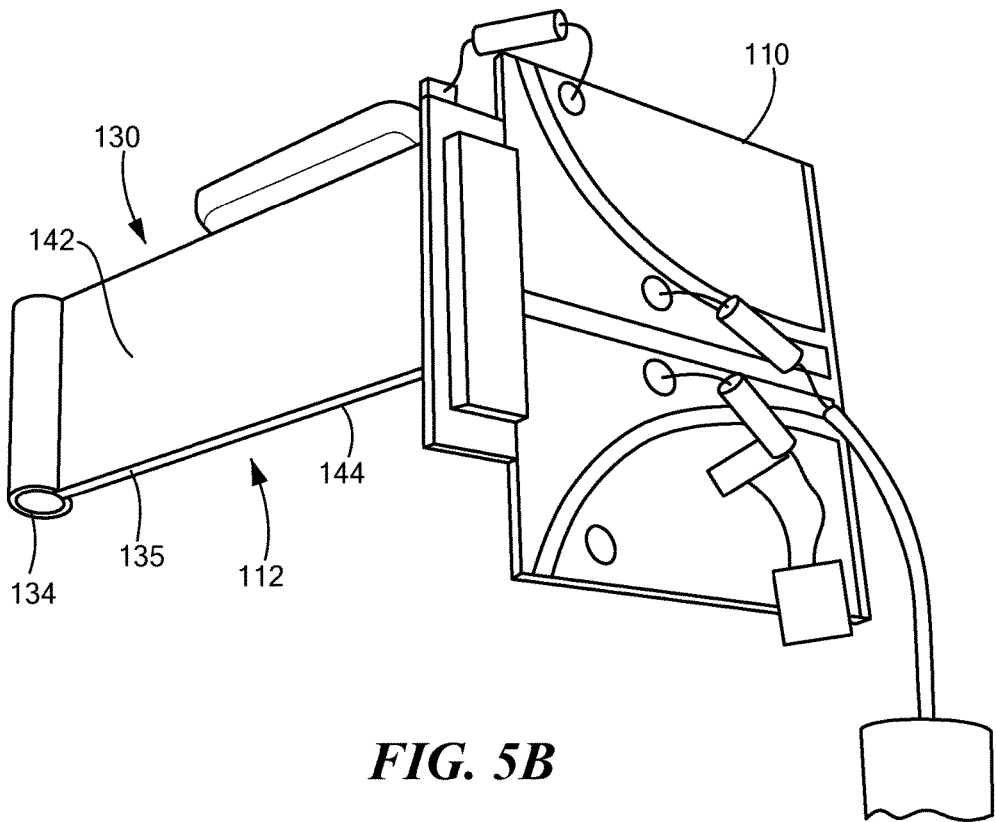
FIG. 5B is a three-dimensional isometric-view showing in further detail one of the plurality of input and output impedance matching networks shown in one or more of FIGS. 2-4.

In one design, system 100, FIGS. 2 and 3, may include a plurality of input impedance matching networks 110, FIG. 3, shown in further detail in FIGS. 4 and 5A-5B, each coupled to one of the plurality of high-power transistor 108. Each input impedance matching network 110 preferably matches the impedance of radio frequency (RF) signals to the input impedance of high-power transistors 108. FIG. 5A shows a schematic front-view showing in further detail the primary components of one example of one input impedance matching network 110. In this example, input impedance matching network 110 includes inductors 152, 154, and 156, radio frequency (RF) balun 158, and exponential taper impedance matching line 160. In other designs system 100 need not necessarily include input impedance matching network 110 when the impedance of input RF signals matches the impedance of high-power transistors 108.

System 100 also includes a plurality of output impedance matching networks 112, FIGS. 2, 3, 5B, 5C, 6, 7, and 8A, each coupled to one of high-power transistors 108 which extend into resonant cavity 102 as shown and discussed in detail below.

Each output impedance matching network 112 coupled to one of high-power transistor 108 matches the impedance of its high-power transistor 108 to an impedance of resonant cavity 102 and electromagnetically couples power from its high-power transistor 108 into resonant cavity 102 to provide a combined high-power output to output port 104, FIGS. 2 and 3, coupled to high-power transmission line 106. In one example, the combined high-power output by system 100 may be about 3 kW provided by four combined output impedance networks 112 and their associated high power transistors 108 or may be about 6 kW for eight output impedance networks 112 and their associated high power transistors 108, e.g., as shown in FIG. 4.

The result is resonant cavity combined solid-state amplifier system 100 directly, efficiently and effectively combines the power from each of the plurality of high-power transistors 108 in one stage to a combined high-power output of the high-power transistors 108 in a less complex and cumbersome design than conventional system 10, FIG. 1 discussed above, or similar type systems. Thus, system 100 is more reliable than conventional system 10, or similar type systems, and as will be discussed below, can remain operational if one or more of output impedance networks 112 and/or their associated high power transistors 108 fails.

In one embodiment, each of the plurality of output impedance networks 112, FIGS. 2, 3, 5B, 5C, 6, 7, and 8A preferably include at least one transmission line, e.g., transmission line 130, FIGS. 3, 5B, 5C, 6, 7, and 8A, which extends into resonant cavity 102 as shown. Transmission line 130 of each of output impedance matching networks 112 preferably matches the impedance of its high-power transistor 108 to the impedance of resonant cavity 102. Transmission line 130 of each output impedance matching network 112 preferably includes coupling loop 134, FIG. 2, shown in greater detail in FIGS. 3, 5B, 5C, 6, 7, and 8A configured to electromagnetically couple power from high-power transistor 108 to resonant cavity 102.

Figure 7:
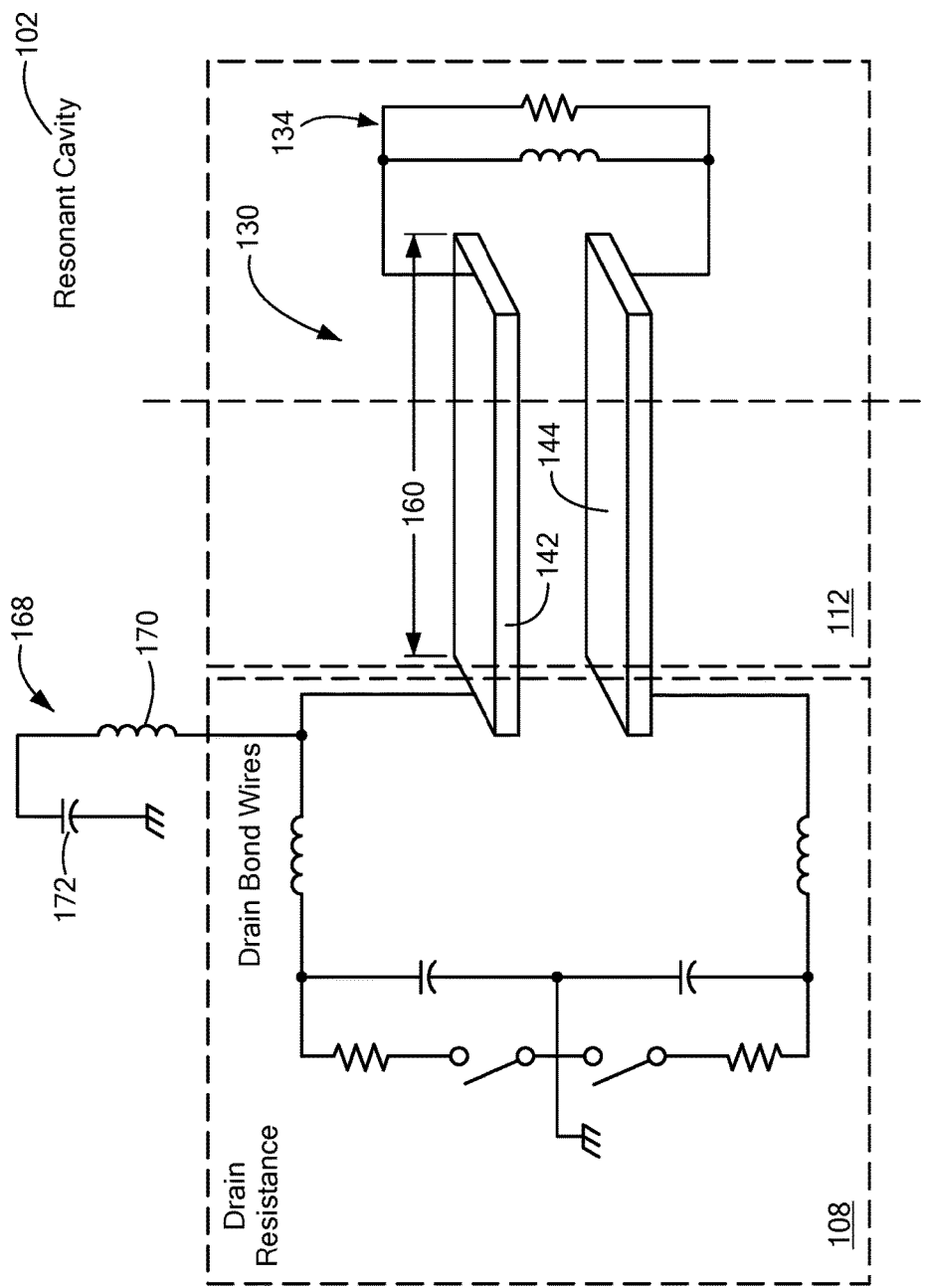
FIG. 7 is an electric circuit diagram showing in further detail one example of one of the plurality of output impedance matching networks shown in one or more of FIGS. 2-6.

FIG. 7 shows a circuit diagram of showing in further detail one example of one output impedance matching network 112 coupled to high-power transistor 108, and transmission line 130. Transmission line 130 preferably includes top surface 142 made of a conducting material, e.g., copper or similar type conducting material, and bottom surface 144 made of a conducting material, e.g., copper or similar type conducting material. Between top surface 142 and bottom surface 144, transmission line 130 preferably includes insulating dielectic material 135, FIG. 5B, shows in further detail one example transmission line 130 with top surface 142, bottom surface 144 with insulating material 135 sandwiched therebetween.

Figure 5C:
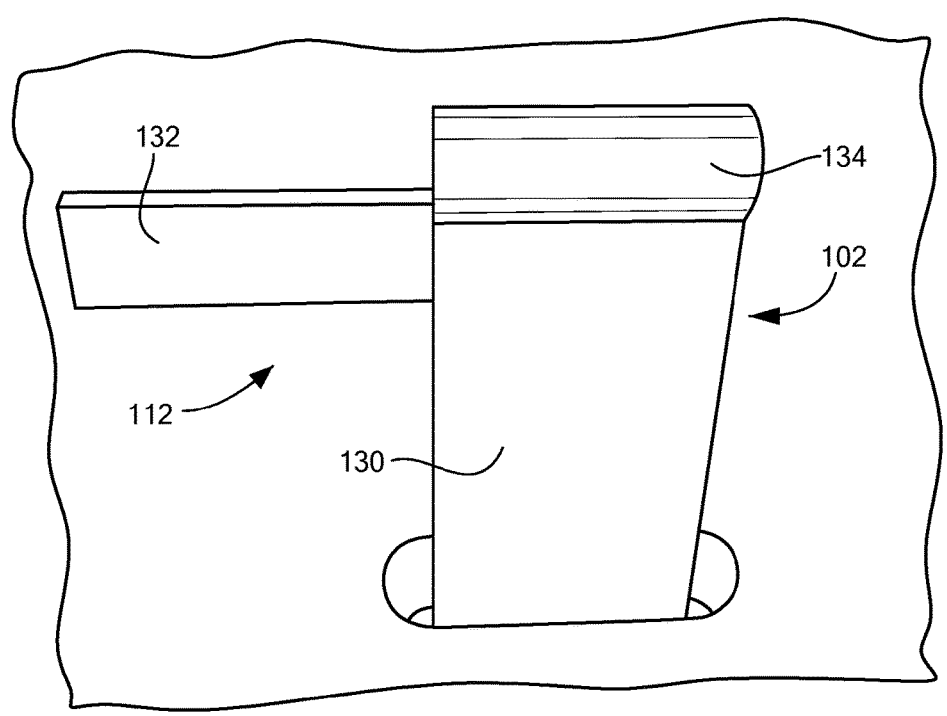
FIG. 5C is a three-dimensional view showing in further detail one example of the coupling loop and the transmission line of the output matching impedance network shown in FIG. 5B.
Figure 6:
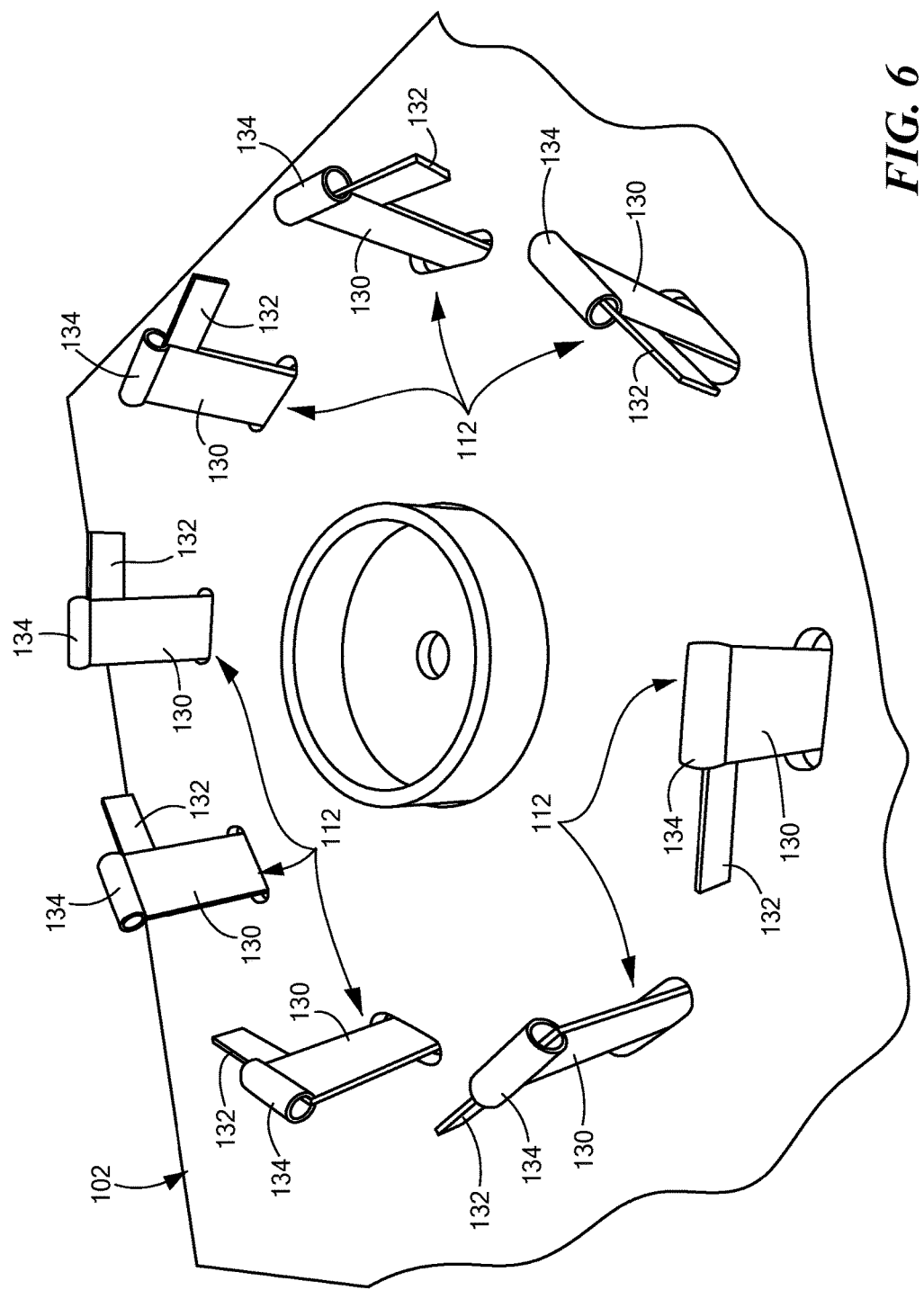
FIG. 6 is a three-dimensional view showing in further detail one example of the output impedance matching network extending into the resonant cavity shown in FIGS. 2 and 3.
Figure 8A:
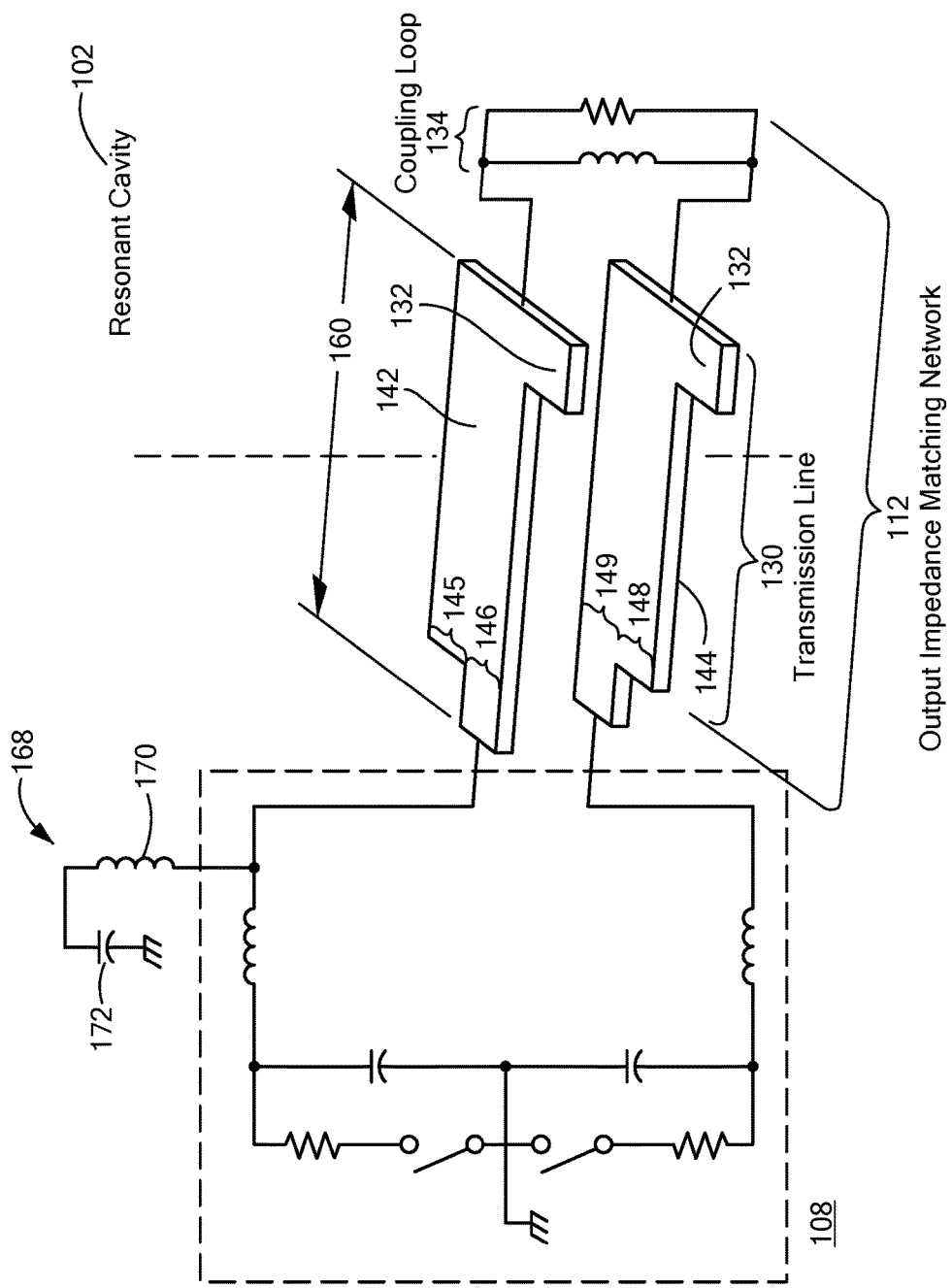
FIG. 8A is an electric circuit diagram showing in further detail one example of one of the plurality of output impedance matching networks shown in one or more of FIGS. 2-6.

In one design, transmission line 130 of each output impedance matching networks 112, FIGS. 2, 3, 5B, SC, 5D, 6, 7, and 8A, preferably includes one or more stubs, e.g., stub 132, FIGS. 5C, 6, and 8A, configured to resonant power from high-power transistor 108 into resonant cavity 102. In one design, stub 132 is preferably an open stub and located proximate the end of transmission line 130 as shown. Preferably, the function of stub 132 is to present to transistor 108 an impedance which efficiently resonates power from transistor 108 to resonant cavity 102. In one design, inserting stub 132 at the end of transmission line 130 as shown compensates the coupling loop inductance and, via the quarter-wavelength transmission line impedance transformation, presents to transistor 108 a desirable slightly inductive load.

Figure 8B:
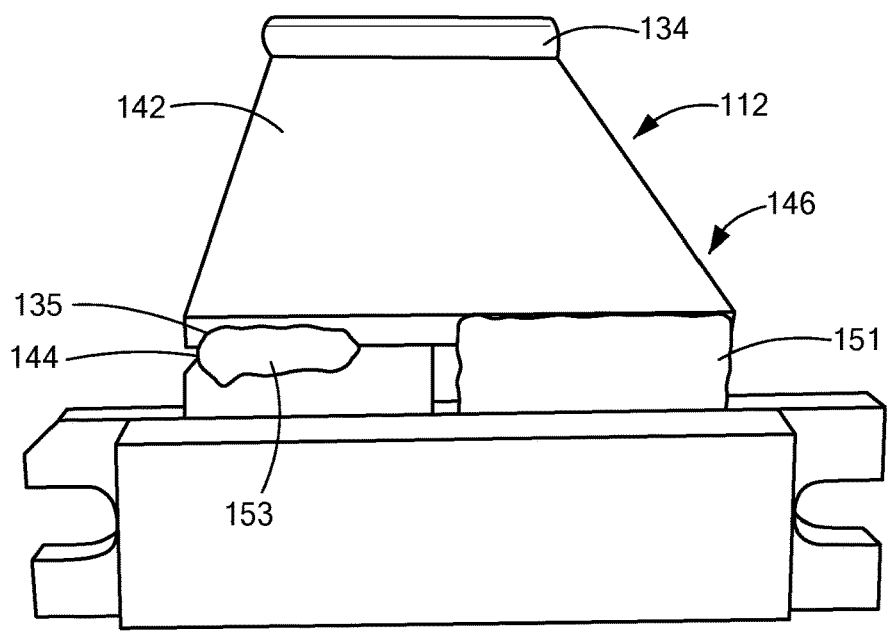
FIG. 8B is three-dimensional view showing one example of the connection points of the transmission line shown in FIG. 8A to a transistor tab coupled to a high power transistor.
Figure 8C:
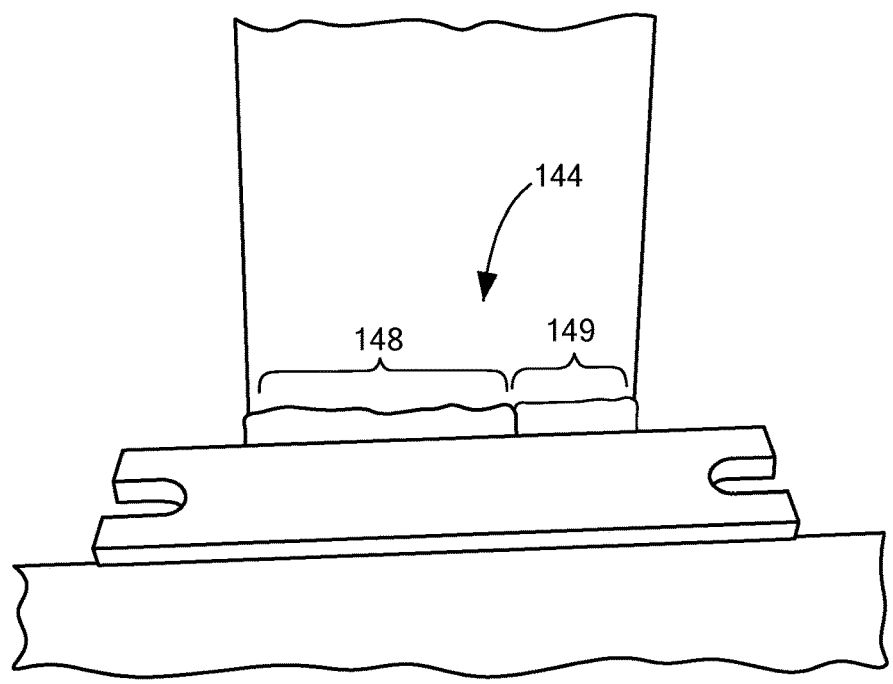
FIG. 8C is three-dimensional view showing another example of the connection points of the transmission line shown in FIG. 8A to a transistor tab coupled to a high power transistor.

In one design, output impedance matching network 112, FIG. 8A preferably includes transmission line 130 with connection points 146 and 149 and removed conductor sections 145 and 148. Similar as discussed above with reference to FIG. 7, transmission line 130, FIG. 8A, preferably includes top surface 142 made of a conducting material, e.g., copper or similar type conducting material, and bottom surface 144 made of a conducting material, such as copper or similar type conducting material. Between top surface 142 and bottom surface 144, transmission line 130 preferably includes insulating dialectic material. FIGS. 5B, 8B, and 8C shows in further detail one example transmission line 130 with top surface 142, bottom surface 144 with insulating material 135 sandwiched there between. Connection points 146 and 149, FIG. 8A, between the transmission line 130 and the two push-pull transistor tabs, preferably have a designed width to give a desired inductance in the output impedance matching network. In this example, connection point 146 is between the top surface 142 of transmission line 130 and one of the transistor tabs, e.g., transistor tab 151, FIG. 8B, (shown covered with soldering material) and connection point 149, FIG. 8A, between the bottom surface 144 and the other transistor tab, e.g., transistor tab 153, FIG. 8B. In one design, connection point 149, FIG. 8A, is preferably less wide than connection point 146, e.g., as shown. The asymmetry of connection points 146 and 149 compensates for a different asymmetric part of the output impedance matching network 112. In this example, section 145 is removed from top surface 142 of transmission line 130 and section 148 is removed from bottom surface 144 of the transmission line 130. FIG. 8C shows an example of trimmed connection point 148 and removed section 149 for bottom surface 144 of transmission line 130. Preferably, an amount of conducting material may be removed to provide a desired connection width between the transistor tabs and the two surfaces of the transmission line 130.

Preferably, each of output impedance matching networks 112, FIGS. 2, 3, 5B, 5C, 6, 7, and 8A, is configured to operate each of high-power transistors 108 in one or more amplification classes including classes A, B, AB, C, D, E, and F. FIG. 7 shows an example of output impedance matching network 112 configured for classes A, B, AB, C, and D. FIG. 8A shows an example of output impedance matching network 112 configured for class, D, E and F.

Figure 10:
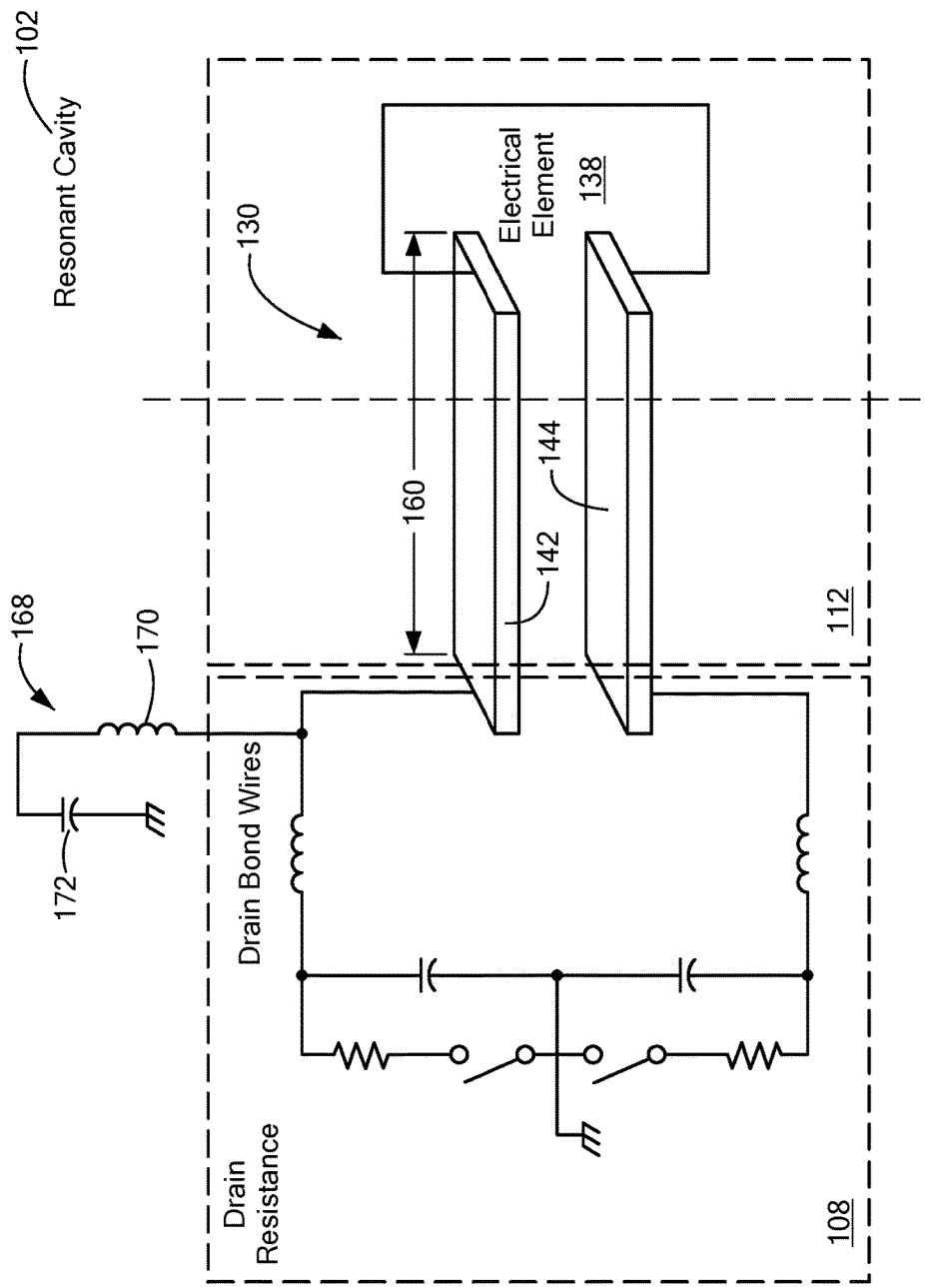
FIG. 10 is an electric circuit diagram showing in further detail one example of one of the plurality of output impedance matching networks shown in one or more of FIGS. 2-9 having an electrical element coupled to the transmission line.
Figure 11:
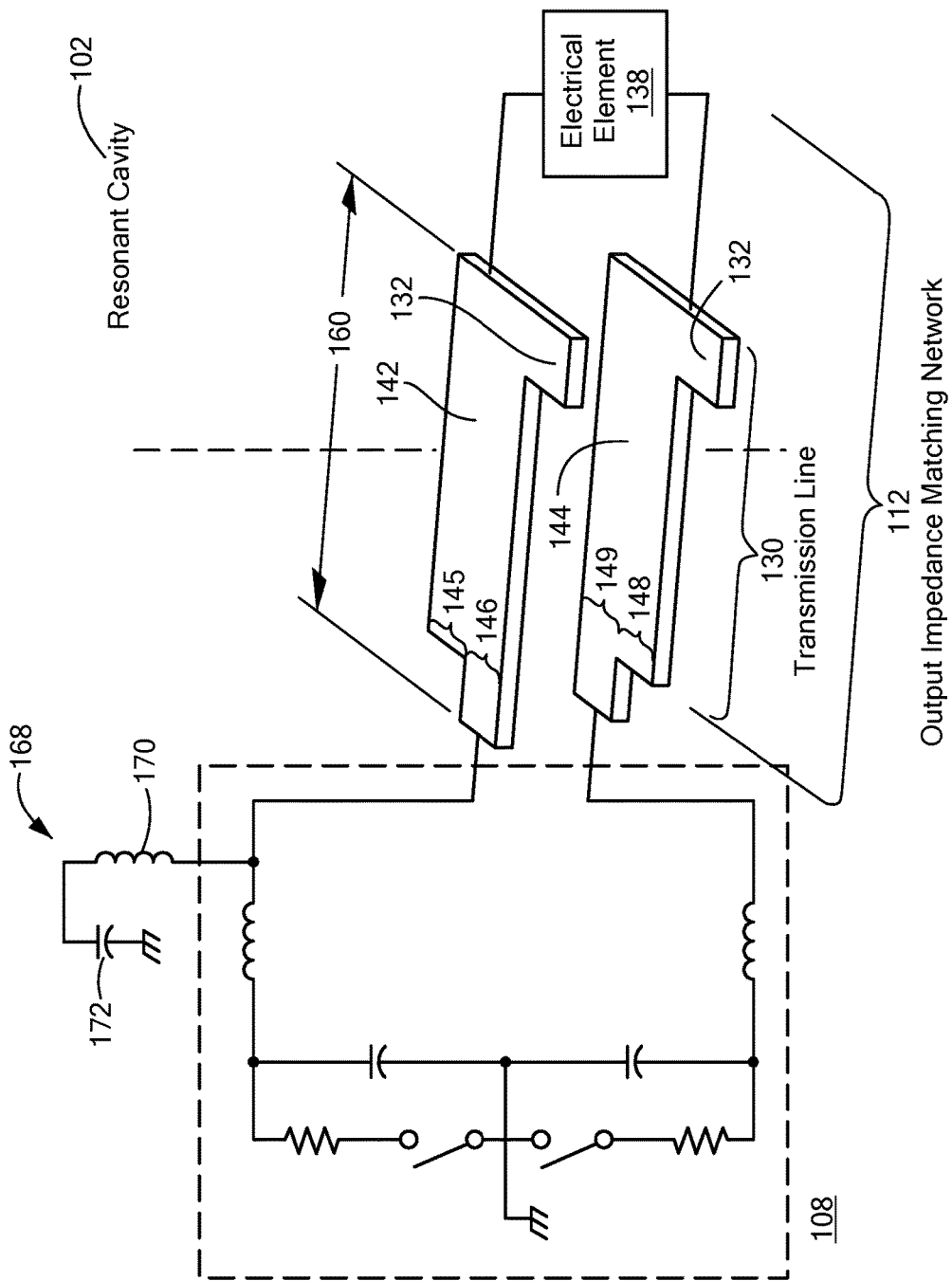
FIG. 11 is an electric circuit diagram showing in further detail another example of one of the plurality of output impedance matching networks shown in one or more of FIGS. 2-9 having an electrical element coupled to the transmission line.

Each of output impedance matching networks 112 may include an electrical element coupled to transmission line 130 to electrically couple power, e.g., electrical element 138, FIGS. 10 and 11, preferably coupled between top surface 142 and bottom surface 144 of transmission line 130 as shown. In one example, electrical element 138 may be configured such that an antenna, monopole, dipole, plate, and the like, such that energy is controlled by transistors 108 and transmitted by transmission lines 130 and coupled to resonant cavity 102 thru electrical element 138 operating via the radiated electric field inducing cavity resonance.

In one example, resonant cavity combined solid-state amplifier system 100 is preferably configured such that failure of one of the plurality of high-power transistors 108, e.g., as shown in one or more of FIGS. 2-8C, does not substantially impede operation of resonant cavity 102. In one design, length 160, FIGS. 7 and 8A, of transmission line 130 of one or more of output impedance matching networks 110, FIGS. 2, 3, 5B, 5C, 5D, 6, 7, and 8A, is configured such that failure of one the plurality of high-power transistors 108 does not substantially impede the operation of resonant cavity 102.

Preferably, the failure of one or more of the high-power transistors 108 includes a soft failure, e.g., a failure that does not substantially impede the operation of system 100. This may be accomplished through a combination of the short-circuit failure mode characteristic of the selected high-power transistors 108, fusible DC choke 170, FIGS. 7 and 8A, and the characteristics of transmission line 130. In one example, to accommodate for a soft failure, the plurality of high-power transistors 108 preferably includes one or more redundant high-power transistors 108. In one design, system 100 may include frequency tuning device 200, FIGS. 2 and 3, configured to tune resonant cavity 102 to compensate for a failure of one or more of plurality of high-power transistors 108. In one design, frequency tuning device 200 preferably includes cavity tuning plunger 202 coupled to tuning rod 204 which extends into resonant cavity 102 as shown and may be positioned in the direction indicated by arrows 206, 208, FIG. 9. Moving cavity tuning plunger 202 in the direction into resonant cavity 102 shown by arrow 206 decreases the resonant frequency. Moving cavity tuning plunger 204 in the direction out of resonant cavity 102 in the direction shown by arrow 208 increases the resonant frequency of resonant cavity.

Figure 9:
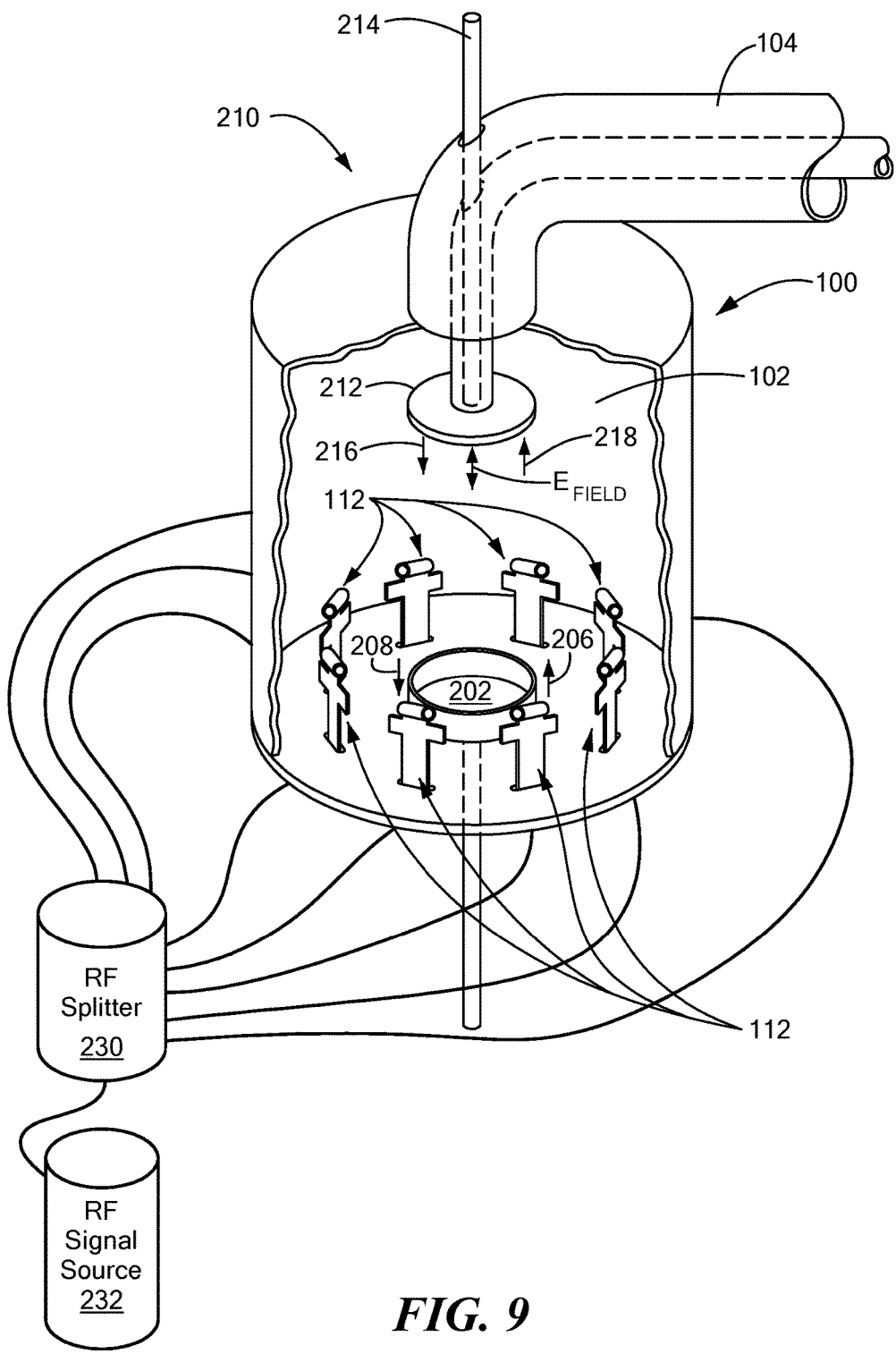
FIG. 9 is a three-dimensional view showing in further detail primary components of one embodiment of the resonant combined solid state amplifier system of this invention.

System 100, FIGS. 2, 3, and 9, also preferably includes variable output coupling device 210 coupled to resonant cavity 102 configured to extract the desired power to the combined high-power output port 104 coupled to high-power transmission line 106 or to compensate for a failure of one or more of the plurality of high-power transistors 108. In one example, variable output coupling device 210 includes variable coupling capacitor plate 212, FIG. 9, coupled to tuning rod 214. Moving variable coupling capacitor plate 212 in the direction into resonant cavity 102, e.g., as shown by arrow 216, FIG. 9, increases electric coupling in resonant cavity 102 which increases the combined high-power output to output port 104 coupled to high-power transmission line 106. Moving variable coupling capacitor plate 212 in the direction out of resonant cavity 102, e.g., as shown by arrow 218 decreases the electric coupling in resonant cavity 102 which decreases the combined high-power output to output port 104, FIG. 2, coupled to high-power transmission line 106.

In one design, length 160, FIGS. 7 and 8A, of transmission line 130 of output impedance matching network 110 may be configured to provide approximately ¼ wavelength transmission line impedance transformation at the fundamental frequency of resonant cavity 102. In another design, length 160, FIG. 7, of transmission line 130 of output impedance matching network 110 may be configured to provide approximately ½ wavelength transmission line impedance transformation at the fundamental frequency of resonant cavity 102.

In one design, each of the plurality of output impedance matching networks 112, FIGS. 2, 3, 5B, 5C, 6, 7 and 8C preferably, includes DC power choke and fuse 170, FIGS. 7 and 8A, coupled between DC bus capacitor 172 and output impedance network 112 as shown which are fused in the event high-power transistor 108 fails.

In one example, the plurality of high-power transistors 108, shown in one or more of FIGS. 2-8C preferably includes a predetermined number N of high-power transistors. In the example shown in FIGS. 4 and 6, the predetermined number N of high-power transistors 108, FIG. 4, is eight high-power transistors 108. In other examples, the predetermined number N of high-power transistors 108 may any number of high-power transistors 108 needed to provide a desired combined high-power output which is output to at least one output port 104, FIGS. 2, 3, and 9, coupled to high-power transmission line 106. As shown in FIG. 2, there may be up to 20 or more high-power transistors 108 directly coupled to upper plate 114 and/or to lower plate 118, where high-power transistors 108 cannot be seen but coupling loops 134 attached to transmission line 130 can be seen extending into resonant cavity 102. Preferably, the combined power of the predetermined number N of high-power transistors is combined in the resonant cavity as combined high-power output which is output to at least one output port 104, FIGS. 2, 3, and 9.

In one design, system 100 preferably includes RF cavity splitter 230, FIGS. 4 and 9, coupled to RF signal source 232. RF cavity splitter 230 is configured to simultaneously divide an RF signal from RF signal source 232 by line 234, FIG. 4, into identical separate RF drive signals for each of the plurality input impedance matching networks 110 coupled to one of the plurality of high-power transistors 108, e.g., by lines 236, 238, 240, 242, 244, 246, 248, and 250.

In one example, system 100 may include cooling line 280, FIG. 4, in this example, embedded in plate 114 of resonant cavity 102, FIGS. 2 and 3, configured to cool plate 114 and each of the plurality of high-power transistors 108 directly thermally coupled to plate 114 of resonant cavity 102. In a similar manner, system 100 may include cooling line 280, FIG. 3, embedded in plate 118, FIGS. 2 and 3, of resonant cavity 102 configured to cool plate 118 and each of the plurality of high-power transistors 108 directly thermally coupled to plate 118. In one design, system 100 may include coolant inlet lines 284 and 285, FIG. 2, which receive a flow a coolant liquid, e.g., water, glycol, mineral oil, or similar type coolant fluid and provided the coolant to a cooling line embedded in upper plate 114, FIGS. 2 and 3, and lower plate 118, respectively. FIG. 4 shows an example of cooling line 280 embedded in lower plate 118. System 100 also preferably includes coolant outlet lines 286 and 287, FIG. 2, which output a flow of heated coolant liquid. In one design, system 100 may include low current bias input 288, high current drain port 290 and RF shield 292.

Figure 12:
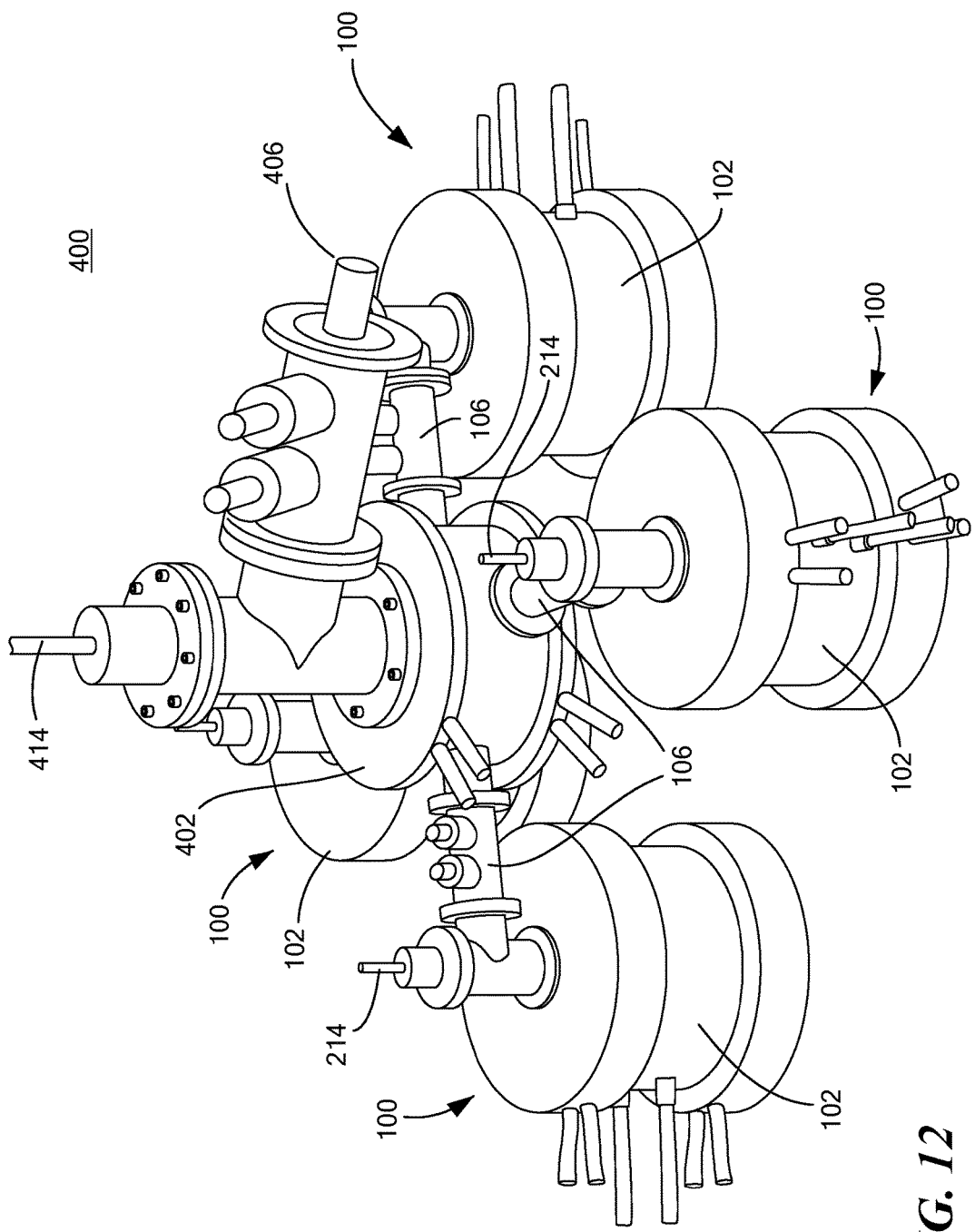
FIG. 12 is a three-dimensional isometric-view showing one example of a plurality of resonant cavity combined solid-state amplifier systems shown in FIGS. 2-7 combined together to provide a modular resonant cavity system.

Modular resonant cavity system 400, FIG. 12, includes a plurality of resonant cavity combined solid-state amplifier systems 100 as discussed above with reference to one or more of FIGS. 1-11, which each output a combined high-power output to output port 104, FIGS. 2 and 3, coupled to high-power transmission line 106. The combined high-power from each of resonant cavity 102, FIG. 12, is combined by combiner resonant cavity 402 to provide a combined high-power output to high-power transmission line 406. Combiner resonant cavity 402 may include tuning rod 414 coupled to a variable coupling capacitor plate similar to tuning rod 214, as discussed above with reference to FIGS. 2, 3, and 9. In the example shown in FIG. 12, four resonant cavity combined solid-state amplifier systems 100 are combined using combiner resonant cavity 404. In other examples, system 400 may include more or less than four resonant-cavity combined solid-state amplifier systems 100 as needed to provide a desired combined high-power output to high-power transmission line 404. In the example shown in FIG. 12, the combined high-power output may be in the range of about 100 kW to about 200 kW.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant cannot be expected to describe certain insubstantial substitutes for any claim element amended.

Other embodiments will occur to those skilled in the art and are within the following claims.

What is claimed is:

1. A resonant cavity combined solid-state amplifier system comprising:
   a resonant cavity including at least one output port coupled to a high-power transmission line;
   a plurality of high-power transistors each configured to generate a variable amount of power input directly into the resonant cavity; and
   a plurality of output impedance matching networks each including at least one transmission line and each coupled to one of the plurality of high-power transistors and extending into the resonant cavity and configured to match an impedance of each said transistor to an impedance of said resonant cavity and configured to electromagnetically couple power from each of said plurality of high-power transistors into the resonant cavity to provide a combined high-power output to the high-power transmission line.

2. The system of claim 1 in which each of the output impedance matching networks includes a coupling loop coupled to the transmission line to electromagnetically couple power.

3. The system of claim 1 in which each of the output impedance matching networks includes an electric element coupled to the transmission line to electromagnetically couple power.

4. The system of claim 1 in which the plurality of transistors includes a predetermined number N of high-power transistors.

5. The system of claim 4 in which a combined power of the N high-power transistors is combined in the resonant cavity to provide the combined high-power output.

6. The system of claim 1 further including a plurality of input matching, impedance networks each coupled to one of the high-power transistors configured to match an impedance of RF signals to the impedance of one of the high-power transistors.

7. The system of claim 6 further including an RF cavity splitter coupled to each of the plurality of input impedance matching networks configured to simultaneously divide an RF signal from an RF signal source into identical separate RF drive signals for each of the plurality input impedance matching networks each coupled to one of the plurality of high-power transistors.

8. The system of claim 1 in which the transmission line includes one or more stubs configured to resonate power from each of the plurality of transistors into the cavity.

9. The system of claim 8 in which the one or more stubs are located proximate an end of the transmission line.

10. The system of claim 1 in which each of the output impedance matching networks is configured to operate the plurality of transistors in one or more amplification classes.

11. The system of claim 10 in which the amplification classes include one or more of amplification classes: A, B, AB, C, E, and F.

12. The system of claim 1 in which the plurality of high-power transistors is configured such that a failure of one or more of the plurality of high-power transistors does not substantially impede operation of the resonant cavity.

13. The system of claim 12 in which each of the output impedance matching networks includes at least one transmission line having a length configured such that a failure of one or more of the plurality of transistors does not substantially impede operation of the resonant cavity.

14. The system of claim 12 in which each of the output impedance matching networks includes at least one transmission line having a length configured to provide approximately a ¼ wavelength transmission line impedance transformation at a fundamental frequency of the resonant cavity.

15. The system of claim 12 in which a failure of one or more of the plurality of high-power transistors includes a soft failure.

16. The system of claim 12 in which the soft failure includes at least one shorted high-power transistor or a fused DC choke.

17. The system of claim 1 further including a DC power choke coupled between a DC bus and each of the plurality of output impedance networks are configured to isolate a failed transistor of the plurality of high-power transistors from the DC bus.

18. The system of claim 1 further including a frequency tuning device coupled to the resonant cavity configured to adjust a resonant frequency of the resonant cavity to adjust and/or improve operation of a resonant cavity.

19. The system of claim 1 further including a variable output power coupling device coupled to the resonant cavity configured to extract a desired power to the combined high-power output.

20. The system of claim 1 further including a variable output power coupling device configured to extract a desired power to compensate for a failure of one or more of the plurality of high-power transistors.

21. The system of claim 1 further including a cooling line embedded in one or more plates of the resonant cavity configured to cool the one or more plates of the resonant cavity and each of the plurality of high-power transistors directly thermally coupled to one or more plates.

22. The system of claim 1 in which the transmission line includes asymmetrically trimmed connection points between one of the high-power transistors and the transmission line.

23. A modular resonant cavity system comprising:
- a plurality of resonant cavities each including at least one output port coupled to a resonant cavity high-power transmission line;
- a plurality of high-power transistors each coupled to one of said resonant cavity and configured to generate a variable amount of power input directly to said cavity;
- a plurality of output impedance matching networks each coupled to one of the plurality of high-power transistors of each of the plurality of resonant cavities and extending into each resonant cavity and configured to match an impedance of each said transistor to an impedance of said resonant cavity and configured to electromagnetically couple power from each of said plurality of high-power transistors into said resonant cavity to provide a combined high-power output coupled to said resonant cavity high-power transmission line; and
- and a combiner-resonant cavity coupled to each of said resonant cavity high-power transmission lines configured to combine the high-power of each resonant cavity high-power transmission line to a higher power transmission line.

* * * * *